(12) United States Patent
Uchida

(10) Patent No.: US 6,879,174 B2
(45) Date of Patent: Apr. 12, 2005

(54) TESTING METHOD AND TESTING DEVICE FOR SEMICONDUCTOR INTEGRATED CIRCUITS

(75) Inventor: Ren Uchida, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 103 days.

(21) Appl. No.: 09/941,683

(22) Filed: Aug. 30, 2001

(65) Prior Publication Data

US 2002/0039032 A1 Apr. 4, 2002

(30) Foreign Application Priority Data

Sep. 29, 2000 (JP) .......................................... 2000-299844

(51) Int. Cl.⁷ ............................. G01R 31/26; G09G 3/36
(52) U.S. Cl. ........................................ 324/765; 345/87
(58) Field of Search .............................. 324/765, 158.1, 324/770; 345/84, 87–89, 94, 98–100

(56) References Cited

U.S. PATENT DOCUMENTS 6,160,533 A * 12/2000 Tamai et al. .................. 345/89

FOREIGN PATENT DOCUMENTS

| JP | 63-165932 U | | 10/1988 | |
| JP | 01-227525 A | | 9/1989 | |
| JP | 05-173503 | * | 7/1993 | |
| JP | 05-249920 | * | 9/1993 | |
| JP | 07-326970 A | | 12/1995 | |
| JP | 09-068692 | * | 11/1997 | ........... G02F/1/133 |
| JP | 2000-162281 A | | 6/2000 | |
| JP | 2000-165244 A | | 6/2000 | |

* cited by examiner

*Primary Examiner*—Michael Tokar
*Assistant Examiner*—Paresh Patel
(74) *Attorney, Agent, or Firm*—Birch, Stewart, Kolasch & Birch, LLP

(57) ABSTRACT

The set values of the base power supply voltages are divided between 10 [V] and 0 [V], the upper limit value and the lower limit value of the drive voltage specification of a liquid crystal driver. A base power supply potential difference of 10 [V] between V1 to V2 of the base power supply terminals can be generated. By taking the gradation levels included between V1 to V2 of these base power supply terminals as test objects, each of the neighboring gradation output levels can mutually have a potential difference of about 200 [mV] (base power supply potential difference between the terminals 10000 [mV]/51 gradation levels). For the gradation levels included between these base power supply terminals, for every gradation level, test is performed while changing sequentially the input data and the setting of the judgment level of the comparator, and the gradation levels included in this interval are all tested.

4 Claims, 9 Drawing Sheets

US 6,879,174 B2

TESTING METHOD AND TESTING DEVICE FOR SEMICONDUCTOR INTEGRATED CIRCUITS

BACKGROUND OF THE INVENTION (1) Field of the Invention

This invention relates to the testing method and the testing device for semiconductor integrated circuits related to the gradation output voltages of semiconductor integrated circuits having the function of outputting a plurality of gray scale levels (hereinafter referred to as "gradation levels") and a plurality of DA converters (hereinafter referred to as "DAC"). It relates to the testing method and the testing device for semiconductor integrated circuits wherein the respective DAC can execute the output of the gradation output voltages in a short time and with a high accuracy. Here, gray scale level means the output voltage level determining the brightness or darkness level related to the dot display of liquid crystal panels and so on.

(2) Description of the Prior Art

Accompanying with the high definition of the liquid crystal panels, the liquid crystal driver LSI mounted on liquid crystal panels progresses towards multi-output and multi-gradation. The liquid crystal driver LSI has a "Gamma correction resistor circuit", or a "Gamma correction capacitor circuit" as a base voltage generation circuit integrated inside the device. Voltage is applied to the base power supply input terminals of this base voltage generation circuit. The number of gradation levels of the liquid driver LSI is determined by the division ratio (resistance division ratio in the case of Gamma correction resistor circuit, and capacitance division ratio in the case of Gamma correction capacitor circuit) for this applied voltage. The more minutely refined this division ratio is, the more gradation levels there are.

In addition, to carry out this multi-gradation display, the liquid crystal driver has built-in DACs (converts digital input image data into analog gradation output voltage) corresponding to the number of gradation levels, and outputs the gradation voltages. For example, a liquid crystal driver for 64 gradation display use has a 6 bit built-in DAC, a liquid crystal driver for 256 gradation display use has a 8 bit built-in DAC, and a liquid crystal driver for 1024 gradation display use has a built-in 10 bit DAC.

In the test for a multi-gradation, multi-output liquid crystal driver such as these, whether all the respective gradation voltage values output from the DACs have been output to the correctly converted voltage values corresponding to the digital image data of each level, or, between each of the DACs, whether the output gradation voltage values are mutually uniform, is tested.

Taking a liquid crystal driver with a built-in DAC of m output and n gradation levels as an example, the conventional test method will be described.

In FIG. 1, a schematic block diagram of a circuit of conventional semiconductor test equipment made of a liquid crystal driver and a high accuracy voltage measurement device is shown.

From a semiconductor test equipment (hereinafter referred to as "tester") 60 to the liquid crystal driver 51, gradation digital data equaling to the number of all output terminals set beforehand, for every gradation level, is sequentially input to the base power supply voltage input terminals 6-1~6-x. In the base voltage generation circuit 8, base voltages are generated. The digital data of every gradation level are DA converted (base voltages are selected corresponding to the gradation level data) by the built-in DAC circuit 2-1~2-m in the device. And, through the output amplifiers, as gradation output voltages, analog voltages are output from the output terminals 3-1~3-m.

The analog voltages output from the liquid crystal driver 51 are input into the tester channels 11-1~11-m being input terminals of the tester 60. Using the built-in voltmeter of high accuracy 62 in the tester 60, the outputs are tested one by one till the m-th output sequentially. The voltage values for every gradation level are analog tested, and the test results are saved each time in the built-in memory 63 in the tester 60.

The operation is repeated for the n gradations, and finally the data for all outputs, all gradations are saved in the memory 63. As a result, m×n voltage value data are saved. All the voltage values saved in the memory 63 are computed using the built-in computational device 64 in the tester 60. In this way, every gradation voltage value (hereinafter described as "the maximum value difference and minimum value difference of the gradation output voltages for ideal gradation output voltage values") for every output, and the uniformity of gradation voltage values between every output (hereinafter described as "inter-terminal fluctuation"), can be found by calculation.

As for the general judgment references for gradation voltage values, taking all output terminals 3-1~3-m as objects, for ideal gradation output voltage values of every gradation level, they are the three values of the maximum deviation and minimum deviation of the gradation output voltages, and the inter-terminal fluctuation. Here, for the ideal gradation output voltage values, the judgment values for the maximum deviation and the minimum deviation of the gradation output voltages is, e.g., ±30 [mV], and for the inter-terminal fluctuation, a reference value of about 35 [mV]. As it is necessary to pick out the defective ones by these reference values, very high measurement accuracy is needed.

Up to here, the existing test method of gradation output voltages is described. However, besides the test for gradation output voltages, the test for liquid crystal driver also carries out tests for the items of input leak, Gamma correction resistance value, function operations, high-rate clock operation, current consumption, etc. However, in the test execution time for all these test items, 70–80% is taken up by the test for gradation output voltages.

In the judgment module mounted in the tester, besides the high-accuracy voltage measurement device, there is a comparison judgment circuit (hereinafter "comparator").

In FIG. 2, a schematic block diagram of the circuit of a conventional semiconductor test device made of a liquid crystal driver and a comparator is shown. Here, the gradation output voltages output by the liquid crystal driver 51 are judged by the built-in comparator 12-1~12-m in the tester 70.

Similar to the conventional tester 60 by a high-accuracy voltage measurement device, a number of the pre-set gradation digital data equaling to the total number of output terminals is sequentially input for every gradation level by the tester 70 to the liquid crystal driver 51. The gradation digital data of every level are converted (the base voltage corresponding to the gradation level data is selected) by the built-in DAC circuit 2-1~2-m in the device. Through an output amplifier, analog voltages are output from the output terminals 3-1~3-m as output voltages of the gradation levels.

These analog voltages are input into the comparator 12-1~12-m of the tester 70, to carry out judgment by the comparison judgment voltage level values corresponding to the number of sets of predetermined gradation digital data equaling to the total number of output terminals.

In FIG. 3, the correlation diagram of the set voltage of the judgment base level and the gray scale output voltages at the time of comparator judgment is shown.

Comparison judgment voltage levels show, corresponding to the gradation output voltage value of every level, the two voltage values determining its upper limit, and lower limit. In this figure, the voltage region in between the upper limit and the lower limit is judged to be PASS, and the region above the upper limit, and the region below the lower limit are shown to be judged FAIL. However, according to the test contents (the setting of expectation values), the setting of the opposite is also possible.

A liquid crystal driver that can test using test devices of comparators has been disclosed in Japanese Patent Application Laid-open 2000-165244. FIG. 4 shows a block diagram of the circuit showing this liquid crystal driver.

The liquid crystal driver LSI 81 shown in FIG. 4 provides the gradation data to the bus line 83 of the DAC through the decoder 82. Corresponding to every gradation data, one of the gradation voltage selection switch 85, which decides the output voltage from the base power supply terminal 6-1~6-10 and the resistance divider circuit 13, is selected. And the respective gradation voltages are output through the output amplifier 84 from each output terminals 3-1~3-m.

Its structure is such that in between every base power supply terminals 6-1~6-10, relays 85, 86 are connected in a series circuit, and to the connection point of the relays 85, 86, the mid-point of the resistance divider circuit 13 is connected.

To the base power supply terminal at one end, a power supply voltage (5V) is applied, and the base power supply terminal at the other end is applied with the ground voltage (0V). Now, when testing the upper part, relay 85 is turned OFF, and relay 86 is turned ON. As a result, at both ends of the upper part of the resistance divider circuit 13, a voltage of 5V is applied.

Next, the specified gradation data is applied to the decoder 82 to make it output an analog voltage. At this time, the potential difference between every output voltage is 5V/4= 1.25, a very big value. That is, the first gradation voltage is 5 V, the second gradation voltage is 3.75 V, the third gradation voltage is 2.5 V, the fourth gradation voltage is 1.25 V, the fifth gradation voltage is 0 V. Thus, for example, if the comparator has an accuracy of less than 0.5V, the voltage of every gradation can be recognized, and digital judgment using a comparator is possible. When testing the lower part, the first relay 85 is turned ON, and the relay 86 is turned OFF.

The problems of conventional semiconductor test equipment are summarized as follows.

(1) The Problem of Test Using High Accuracy Voltage Measurement Device

The semiconductor circuit test using a high-accuracy voltage measurement device is shown in FIG. 1. In the tests of liquid crystal drivers, because of the movement towards multi-output and multi-gradation, as the output judgment of the devices has to be processed sequentially, the increase in the amount of data to be read and the increase in data processing time escalate. The test time increases tremendously in the gradation output voltage test. Moreover, as it is necessary to measure more accurately the gradation output voltage values, an expensive tester mounted with a plurality of high-accuracy voltage measurement device is required.

Furthermore, test accuracy becomes more difficult to ensure, because of the advance of multi-gradation. That is, because of the advance of multi-gradation, the potential differences between the outputs of every gradation level are greatly decreased. This is decided by, the aforementioned, the Gamma correction resistor circuit integrated inside the device as a base voltage generation circuit, through the resistance division ratio against the voltage applied from the base power voltage input terminals. The more minutely divided this division ratio is, the more advanced the multi-gradation is. That is, by simple calculation, the output gradation potential difference between neighboring gradations of a 6 [V] driven liquid crystal driver of 64 gradations is 93.75 [mV] (6000 [mV]/64 gradation). By contrast, that of a 6 [V] driven liquid crystal driver of 256 gradations is 23.44 [mV] (6000 [mV]/256 gradation). As a result, when the output potential differences between neighboring gradation for every gradation level is smaller than the output voltage deviation (inter-terminal fluctuation), for the foregoing values, because of the improper reading in of the data, corruption by one gradation, etc., may occur. Even in tests by high-accuracy voltage measurement device, it is difficult to ensure that the test accuracy that the output voltage of every gradation level corresponds to the image digital data. Moreover, setting the judgment values critically for the test for inter-terminal fluctuation is difficult for the specification of the liquid crystal drivers, even for inter-terminal fluctuation of 35 [mV] of the foregoing judgment reference example.

(2) The Problem of the Test Using a Comparator

The merit of the semiconductor circuit test using the comparator shown in FIG. 2 is that all outputs of the device can be judged altogether in parallel, greatly reducing the test time. As comparators are relatively inexpensive, a plurality of comparators upto the corresponding number of LSI outputs are mounted in a tester.

However, as shown in FIG. 3, the accuracy of a comparator cannot differentiate a gradation output voltage level difference less than 100 [mV]. When a plurality of gradation levels exist in between the minimum width of the comparison judgment voltage levels (base voltage ±100 [mV]), the gradation level being the test object becomes unclear. In addition, the accurate values of the maximum deviation and minimum deviation of every gradation output voltage and the inter-terminal fluctuation between every output cannot be found. Therefore, differentiation of gradation output voltage level differences less than about 0.1 [V] is not possible, and it is difficult to ensure the test accuracy of functional operation precision of the liquid crystal drivers. Hence, in general, comparator judgment is not used in the gradation output voltage test for liquid crystal drivers, and is used now in test items not related to the accuracy of gradation output voltages of liquid crystal drivers.

For instance, when a liquid crystal driver outputs at 3.0 [V] at a specific gradation level, by the accuracy of the comparator, the upper limit value of the comparator judgment of this gradation level has a maximum value of 3.1 [V]. And the judgment lower limit value has a minimum value of 2.9 [V]. That is, the potential difference of these two judgment levels is 0.2 [V]. For the 6 [V] driven liquid crystal driver of 256 gradations shown in the foregoing example, as the gradation output potential difference per gradation is 23.44 [mV], in between these two judgment levels, 8 to 9 gradations of the gradation output levels are included. Hence, tests narrowing down the object to an individual gradation output voltage corresponding to the input data of each gradation level cannot be carried out.

Furthermore, a block diagram of the input setting of conventional base power supply voltage is shown in FIG. 5.

For instance, when a 10 [V] driven liquid crystal driver 1 of 256 gradations has 6 base power supply input terminals, from the high voltage of the gradation output voltages, V1=10 [V], V2=8[V], V3=6 [V], V4=4 [V], V5=2 [V], V6=0 [V] are applied. The gradation output voltage level in between the respective base power supply input terminals, a potential difference of 2 [V], is divided by the division ratio according to the Gamma correction resistance characteristics into the output voltage for each gradation level. Accordingly, in between each of the base power supply input terminals, from the potential difference of 2 [V], if the number of gradation output voltage levels is 51 gradations (dividing the 256 gradations into 5 for each of the base power supply input terminals), the gradation output voltage potential difference for each gradation is about 40 [mV]. When carrying out comparator judgment as shown in FIG. 3, for the comparator accuracy, differentiation of gradation output voltage level difference less than 100 [mV] is not possible. In the minimum width (base voltage ±100 [mV]) of the comparison judgment levels, about 5 gradation level exist (calculated from the judgment width of the comparator 200 [mV]/the potential difference per gradation about 40 [mV]), and the gradation levels being test objects become unclear.

A liquid crystal driver that can differentiate gradation output voltage level difference using a comparator has been disclosed in Japanese Patent Application Laid-open 2000-165244, but for this liquid crystal driver, it is necessary to put on a new relay circuit, which would make a chip area increase. In the design of the device, by equipping the ON resistance of the switch=relay circuit of 1 KΩ in between each of the base power supply terminals, the chip area increases by about 7%. To lower the ON resistance of the switch, it is necessary to further increase the relay circuit area, and as a result, the chip area is further increased.

Moreover, to the resistance division circuit 13 of the gradation output levels being the test objects, the voltage applied should be increased two times theoretically by shorting one side of the relay circuit, however, actually, it could not be increased by upto two times due to the ON resistance of the relay circuit. The reason for this is that as the resistance division circuit (Gamma correction resistance) moves towards low resistance, the ON resistance of the relay circuit increases relatively. Consequently, the voltage drop due to the ON resistance increases, and the effect of voltage increase is not produced to the extent expected.

Furthermore, in the trend towards diversified device functions, when tests are carried out with existing testers (fewer tester channels), the channels to control the relays become necessary, and testing plan becomes complicated.

SUMMARY OF THE INVENTION

The object of the present invention is to provide a testing method and a testing device for semiconductor integrated circuits, to cope with tendency towards multi-output and multi-gradation application for the tests of liquid crystal drivers, to achieve great reduction in testing time and high-accuracy testing, regardless of the measurement accuracy of the judgment module, by manipulation through the setting of the base power supply voltages applied to the base voltage generation circuit, of every gradation voltage level output from the DA converters.

The present invention is made to achieve the aforementioned objective, and its outline is as follows.

First, the first gist of the present invention is a testing method for semiconductor integrated circuits, wherein, in the testing method testing by a semiconductor testing apparatus having a comparison judgment circuit judging a semiconductor integrated circuit integrated with a plurality of DA converters and a base voltage generation circuit determining the gradation output voltage characteristics, by comparison of the gradation output voltages and the reference voltages, wherein the gradation level intervals to be the test objects are decided by the setting of different voltages applied at the base power supply input terminals of the base voltage generation circuit; and the voltages are supplied at and between the base power supply input terminals from the semiconductor testing apparatus; and by assigning correspondence between the input gradation level data signals of the gradation levels in that interval, and the gradation output voltages, the gradation output voltage testing through the semiconductor testing apparatus is made to be digital judgment.

Next, the second gist of the present invention is a testing method for semiconductor integrated circuits according to the first gist, wherein, according to the voltages provided at and between the base power supply input terminals from the semiconductor testing apparatus, the base voltage generation circuit increases or decreases the neighboring gradation output potential differences of every analog voltage output of the semiconductor integrated circuit.

The third gist of the present invention is a testing method for semiconductor integrated circuits according to the first gist, wherein, by assigning correspondence between the voltage settings provided from the semiconductor testing apparatus and the input data, the DA converter and base voltage generation circuit selectively test the output levels of the analog voltage outputs.

Next, the fourth gist of the present invention is a testing method for semiconductor integrated circuits according to the first gist, wherein, proving of the reliability of the test accuracy is made possible by treating the mutual relationship between the computation of the input data corresponding to every output voltage level and of the expectation values of the output voltages in the semiconductor integrated circuit specification and the setting of the output voltage expectation value levels, and the voltage judgment value levels of the comparison judgment circuit carrying out the judgment of the output voltages, and the change of the setting of the test numbers with time, altogether as address or parameter management.

Moreover, the fifth gist of the present invention a testing device for semiconductor integrated circuits, wherein, in a judging testing apparatus, through a comparison judgment circuit, a semiconductor integrated circuit integrated with a plurality of DA converters and a base voltage generation circuit determining the gradation output voltage characteristics, by comparison of said gradation output voltages and reference voltages, wherein different voltages are output to the base power supply input terminal for the end of one side of the gradation level interval being the test object of the semiconductor integrated circuit, and the base power supply input terminal of the other end of the interval.

Next, the sixth gist of the present invention is a testing device for semiconductor integrated circuits according to fifth gist, wherein, the voltages are output to more than two base power supply input terminals including the base power supply input terminal at the end of at least one side of the gradation level interval being the test object of the semiconductor integrated circuits.

Moreover, the seventh gist of the present invention is a testing device for semiconductor integrated circuits according to fifth gist, wherein, base power supply input terminals not connected with the semiconductor testing apparatus are disposed in the gradation level interval being the test object of the semiconductor integrated circuit.

Furthermore, the eighth gist of the present invention is a testing device of semiconductor integrated circuits according to fifth gist, wherein, more than two gradation level intervals being the test objects of the semiconductor integrated circuits are disposed.

In the present invention, at the time of test, for all the gradation output voltages for each gradation level, the neighboring gradation potential difference can be ensured to be greater than the output voltage deviations of the liquid crystal driver. In addition, even for comparators having relatively low judgment accuracy, test narrowed down to the object of an individual gradation output voltage corresponding to the input data of each gradation level is possible. For this reason, separate tests that can easily detect data corruption, etc., inside the DACs, for each gradation level being the test object, become possible. Consequently, ensuring high accuracy in the tests is possible, regardless of the accuracy of the measurement and testing equipment.

Furthermore, because it becomes possible to digitally judge altogether and simultaneously all the outputs in the testing apparatus by comparator circuits, tremendous reduction in testing time, and high-accuracy testing using conventional and inexpensive testers, are made possible.

DESCRIPTION OF THE PREFERRED EMBODIMENTS

In the following, an embodiment of the present invention will be described with reference to the drawings.

Figure 7A:
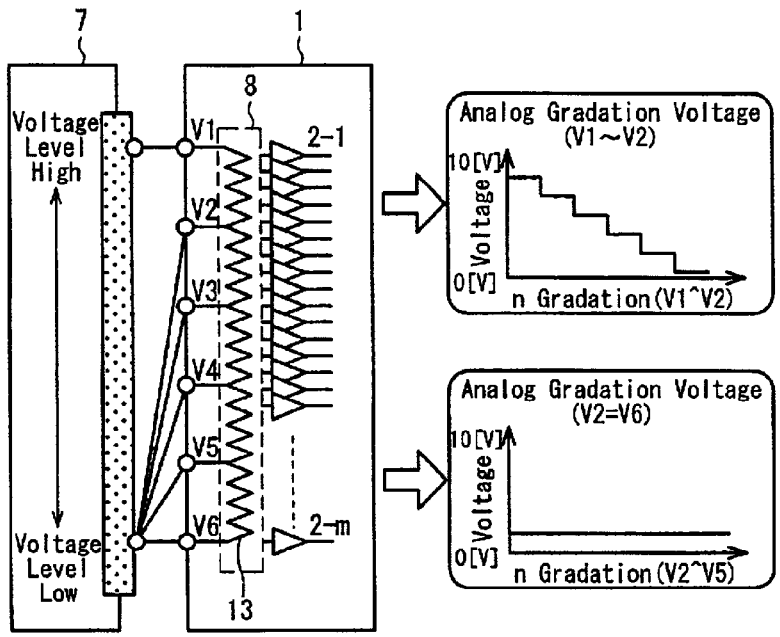
FIG. 7A and FIG. 7B show the circuit block diagrams for the input settings of the base power supply voltages for the liquid crystal driver LSI, base power supply generation circuit of which is the Gamma correction resistance type, according to an embodiment of the present invention.
Figure 7B:
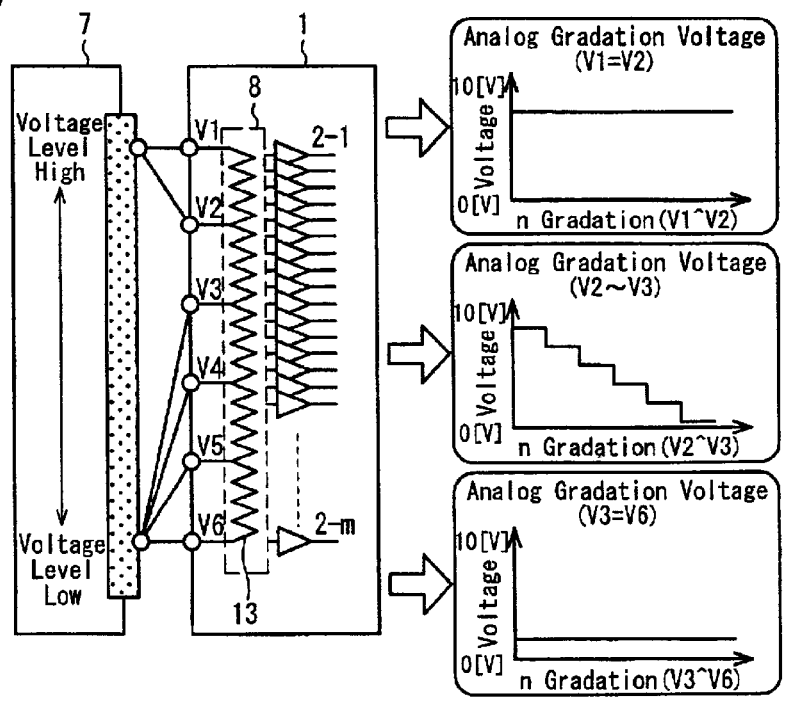

In FIG. 7A and FIG. 7B, a schematic diagram of a input settings example of base power supply voltages, for a liquid crystal driver of a base power supply generation circuit of Gamma correction resistance method, is shown.

Figure 5:
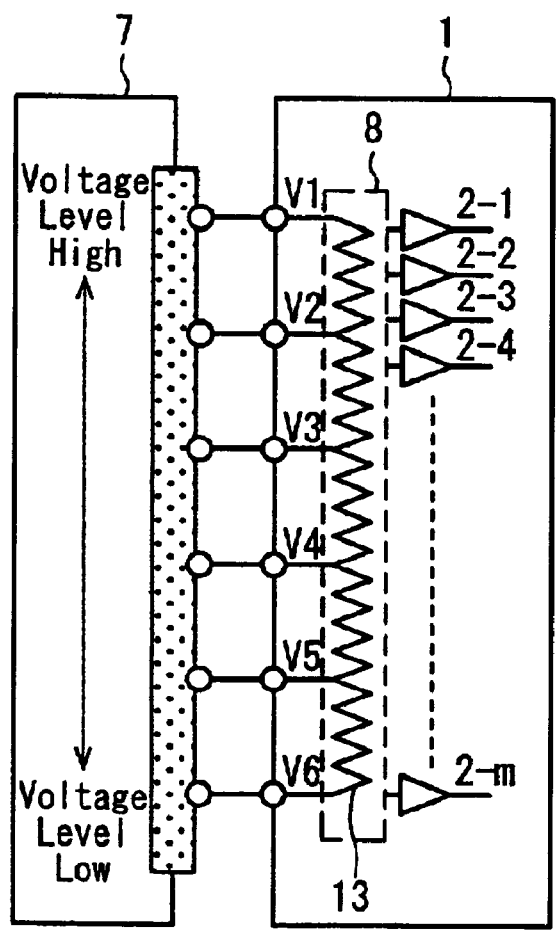
FIG. 5 is a circuit block diagram for the input settings of conventional base power supply voltages.

Liquid crystal driver 1 is equipped with six base power supply input terminals V1 to V6, and a base voltage generation circuit 8 made of a Gamma correction resistance 13, and the DA converters 2-1 to 2-m, and generates m kinds of gradation voltages. Accordingly, the basic structure is the same as the liquid crystal driver 1 of FIG. 5, and is a 10 [V] driven liquid crystal driver of 256 gradations, and shows the same device model as the case in which there are six base power supply input terminals.

Figure 1:
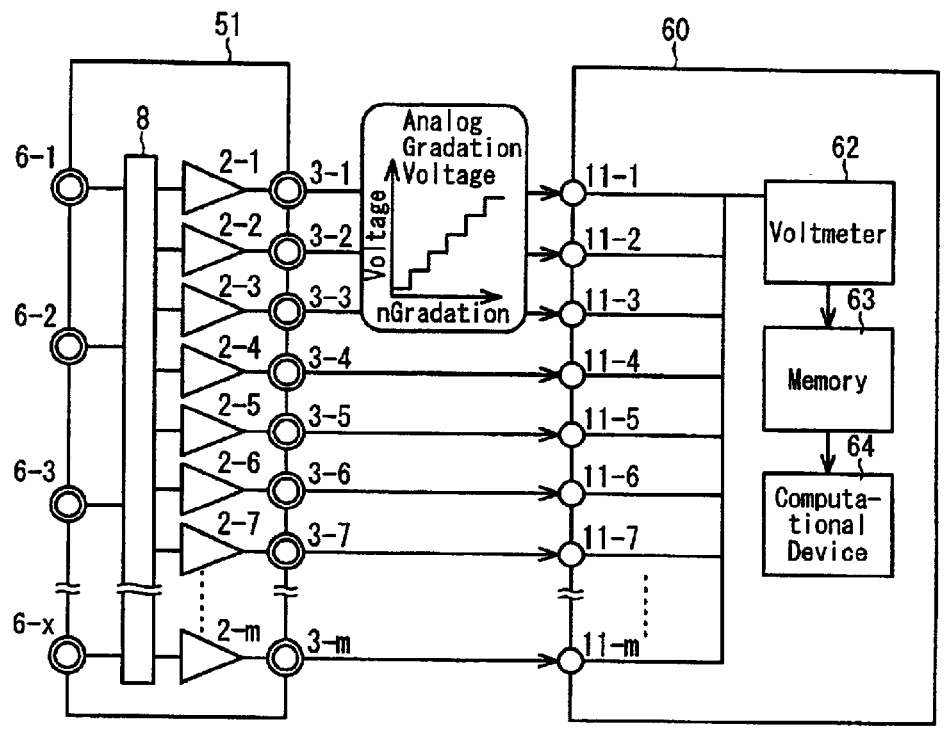
FIG. 1 is a block diagram showing the block structure for judgment with a high-accuracy voltage measurement device of conventional liquid crystal driver LSI testing apparatus.
Figure 2:
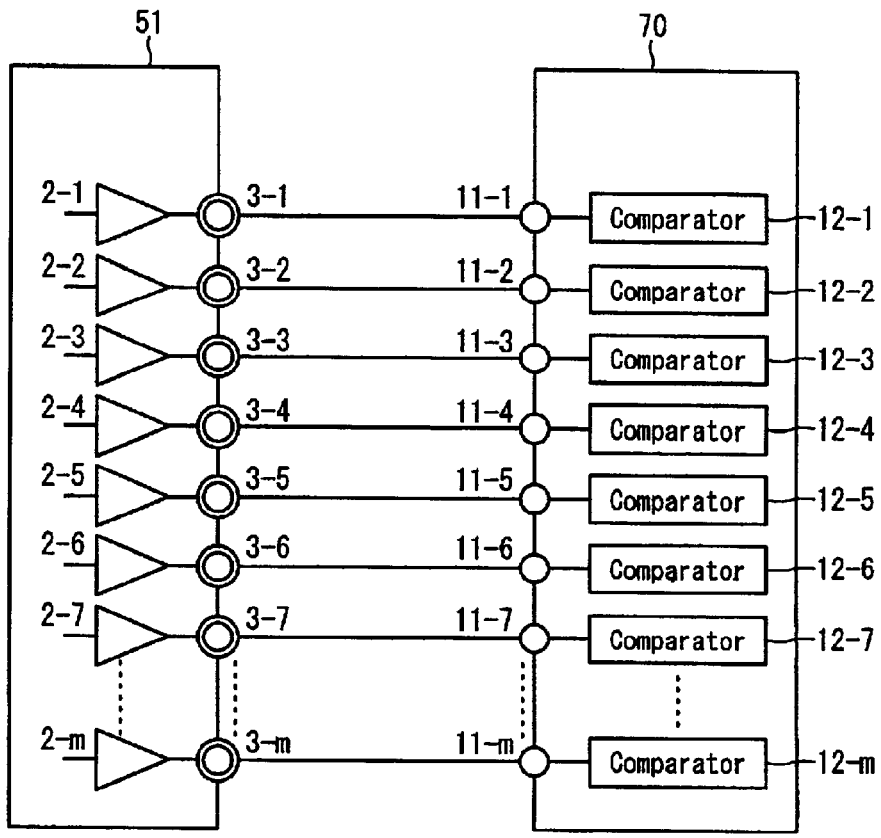
FIG. 2 is a block diagram showing the block structure for judgment with a comparator of conventional liquid crystal driver LSI testing apparatus.
Figure 3:
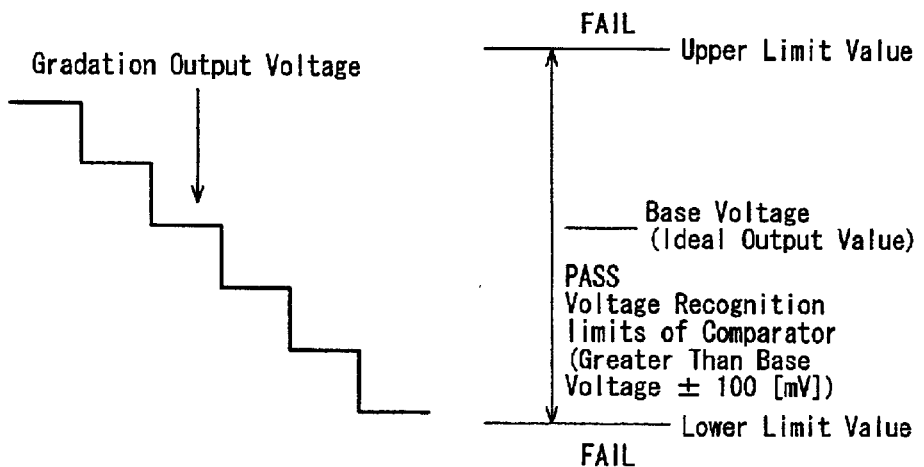
FIG. 3 is a waveform chart of gradation output voltages for explanation of the operation at the time of input setting for conventional base power supply voltages.
Figure 4:
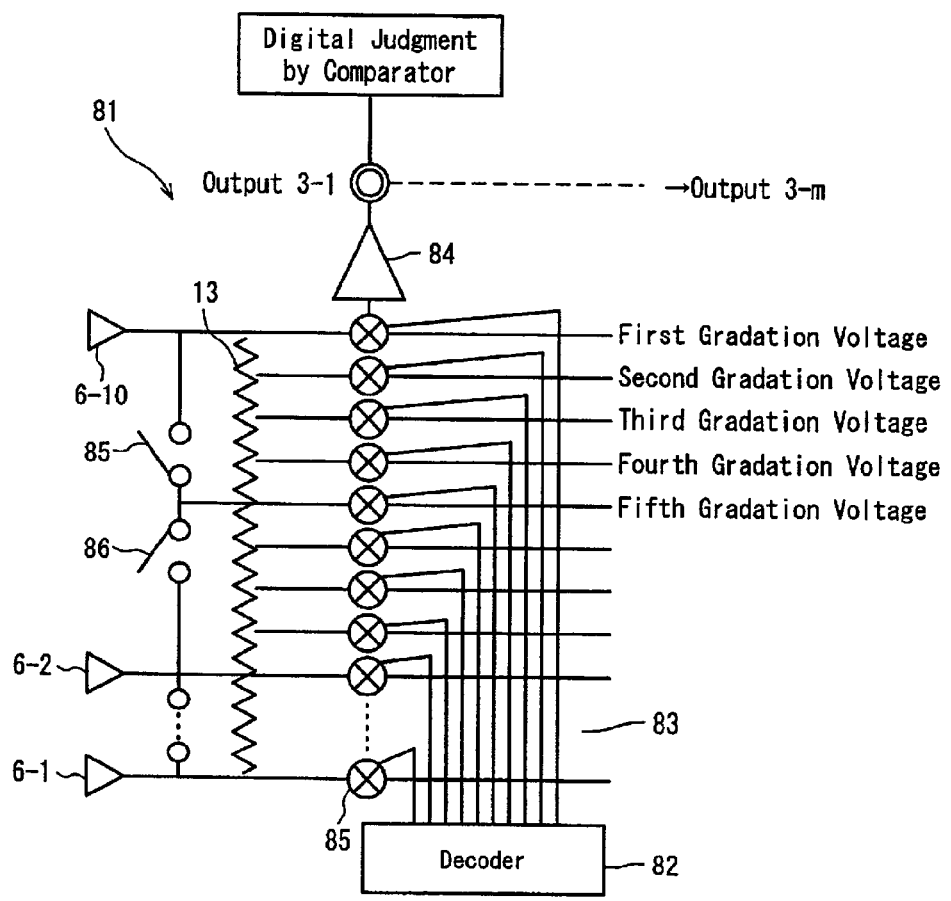
FIG. 4 is a circuit block diagram showing the liquid crystal driver disclosed in Japanese Patent Application Laid-open 2000-165244.

Moreover, in the front section of the liquid crystal driver 1, a tester power supply 7 is placed, which supplies voltages to base power supply input terminals V1 to V6. A tester being the test apparatus of this liquid crystal driver 1 is not shown in the figure, but has the same structure as the tester 70 in FIG. 2. This tester judges the gradation output voltages, output from the liquid crystal driver 1 by a comparator being a comparison judgment circuit.

The test objects are, in FIG. 7A, the DA converters corresponding to the levels in between the base power supply terminal V1 to V2, and in FIG. 7B, the DA converters corresponding to the levels in between the base power supply terminal V2 to V3.

As shown in FIG. 7A, the setting values of the base power supply voltages are divided into the two values of the voltages (the upper limit and lower limit of drive voltage specification of the liquid crystal driver) of 10 [V] and 0 [V], and set to be V1=10[V], V2=0[V], V3=0[V], V4=0[V], V5=0[V] and V6=0[V]. In between the base power supply terminals V1 to V2, a base power supply potential difference of 10 [V] can be produced. Taking the gradation levels included in between the base power supply terminals V1 to V2 as the test objects, the respective neighboring gradation output levels can have mutually a potential difference of about 200 [mV] (potential difference in between base power supply terminals 10000 [mV]/51 gradation levels).

Figure 8:
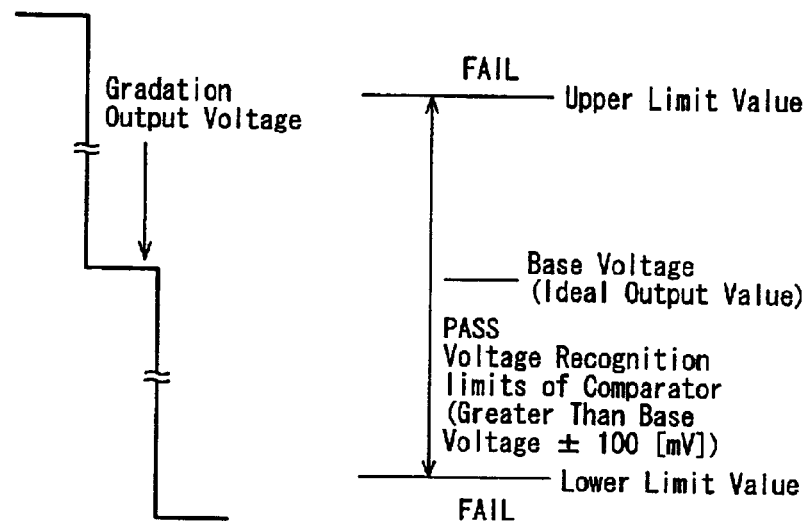
FIG. 8 is a waveform chart of the gradation output voltage, for explanation of the operation of the same embodiment.

Accordingly, as in the correlation diagram of the settings of the judgment levels at the time of the setting operation of the base power supply voltages and the gradation output voltage, shown in FIG. 8, for every gradation level voltage level, the setting of the judgment level of the comparator is possible. Consequently, test narrowing the object down to an individual gradation output voltage corresponding to the input data of one gradation level becomes possible.

For the gradation levels included in between those base power supply terminals, the input data and the settings of the judgment levels of the comparator are tested while changed sequentially, thus all the gradation levels included in that interval are tested.

Subsequently, when the gradation output voltage levels included in between the base power supply terminals V2 to V3 are tested as shown in FIG. 7B, the input settings of the voltages applied to the base power supply terminals are changed again to make the settings of every base power supply voltage to be V1=10 [V], V2=10 [V], V3=0 [V], V4=0 [V], V5=0 [V] and V6=0 [V], and similarly all the gradation levels included in that interval are tested. Similarly, by testing every gradation output voltage level, while changing the settings of every base power supply voltage sequentially, a test narrowing the object down to an individual gradation output voltage, corresponding to the input data of every gradation level, for all the gradation output voltage levels that the liquid driver has, becomes possible.

Here, the foregoing base power supply voltage values applied to the base power supply input terminals are not limited to two values, depending on the judgment accuracy of the measurement and judgment equipment. The detail of this will be described later.

Accordingly, by this testing technique, for all the gradation output voltages of every gradation level at the time of the test, the neighboring gradation potential difference can be ensured to be greater than the output voltage deviation (fluctuation) of the liquid crystal driver. In addition, even for comparators with relatively lower judgment accuracy, tests narrowing the object down to an individual gradation output voltage corresponding to the input data of a gradation level become possible. Hence, separate tests that can detect data corruption, etc., inside DAC for every gradation level being the test object become possible. Consequently, regardless of the accuracy of the measurement and test equipment, high-accuracy tests can be ensured.

Furthermore, by inexpensive test modules made of comparator circuits, etc., (because they are inexpensive, a plurality of them upto the number corresponding to all the outputs of the LSI of them are mounted on the semiconductor testing apparatuses), it is possible to digitally judge all outputs altogether simultaneously. Hence, great reduction of the testing time, and high accuracy tests using conventional inexpensive testers become possible.

FIG. 9A, FIG. 9B, FIG. 10A and FIG. 10B show examples of voltage settings that are applied to the base power supply input terminals of the liquid crystal driver from the tester power supply, in the embodiment of the present invention. For the testing method according to the present invention, the basic principle of the testing method is as follows. Namely, same as in the foregoing description, in the setting of the input voltages applied to the several base power supply input terminals in the semiconductor integrated circuit, only for every gradation output voltage level included between the base power supply input terminals being the test objects, the output potential differences are set to expand. Meanwhile, for every gradation output voltage level included between the base power supply input terminals that are not the test objects, the gradation output potential differences are set to contract. Now, its application examples will be described.

Figure 9A:
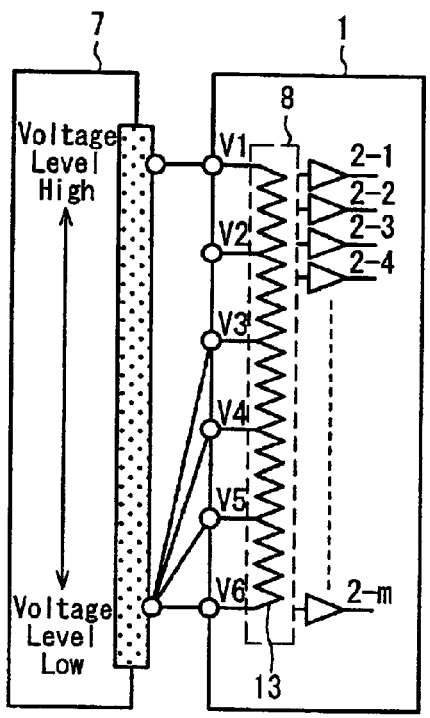
FIG. 9A and FIG. 9B show the circuit block diagrams for the input settings of the base power supply voltages for the liquid crystal driver, base power supply generation circuit of which is the Gamma correction resistance type, according to other embodiment of the present invention.
Figure 9B:
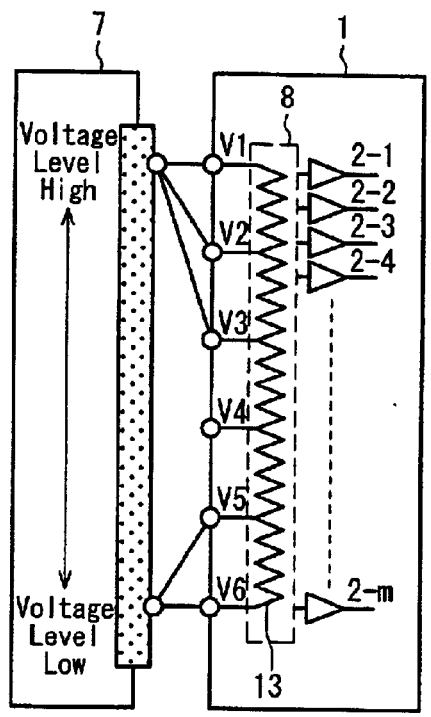

FIG. 9A and FIG. 9B show the schematic diagrams for the input settings of the base power supply voltages for a liquid crystal driver, base power supply generation circuit of which is of the Gamma correction resistance type.

The test objects are, in FIG. 9A, the DA converters corresponding to the levels in between the base power supply terminals V1 to V3, and in FIG. 9B, the DA converters corresponding to the levels in between the base power supply terminals V3 to V5.

FIG. 9A and FIG. 9B show the same device model as a 20 [V] driven liquid crystal driver of 256 gradations, when there are six base power supply input terminals.

As shown in FIG. 9A, the setting values of the base power supply voltages are set to be V1=20[V], V2=open, V3=0[V], V4=0[V], V5=0[V] and V6=0[V]. In between the base power supply terminals V1 to V3, a base power supply potential difference of 20 [V] can be produced. Taking the gradation levels included in between the base power supply terminals V1 to V3 as test objects, the respective neighboring gradation output levels can have mutually a potential difference of about 200 [mV] (potential difference in between base power supply terminals 20000 [mV]/102 gradation levels).

Accordingly, as in the correlation diagram of the settings of the judgment levels at the time of the setting operation of the base power supply voltages and the gradation output voltages, shown in FIG. 8, for every gradation level voltage level, setting of judgment levels of the comparator is possible. Consequently, a test narrowing the object down to an individual gradation output voltage corresponding to the input data of one gradation level becomes possible.

For the gradation levels included in between those base power supply terminals, the input data and the settings of the judgment levels of the comparator are tested while changed sequentially, thus all the gradation levels included in that interval are tested.

Subsequently, when the gradation output voltage levels included in between the base power supply terminals V3 to V5 are tested as shown in FIG. 9B, the input settings of the voltages applied to the base power supply terminals are changed again to make the settings of every base power supply voltage to be V1=20 [V], V2=20 [V], V3=20 [V], V4=open, V5=0 [V] and V6=0 [V] and similarly all the gradation levels included in that interval are tested. Similarly, while changing the settings of every base power supply voltage sequentially, by testing every gradation output voltage level, a test narrowing the object down to an individual gradation output voltage, corresponding to the input data of every gradation level, for all gradation output voltage levels that the liquid driver has, becomes possible.

Furthermore, in the examples for the setting of the base power supply voltages up to now, the setting values of the base power supply voltages are divided between two voltage values (the upper limit value and lower limit value of the drive voltage specification of the liquid crystal driver). However, depending on the number of the gradation levels included in between the base power supply terminals, and the drive voltage of the liquid crystal driver, testing through the settings of the base power supply as follows is also possible.

Figure 10A:
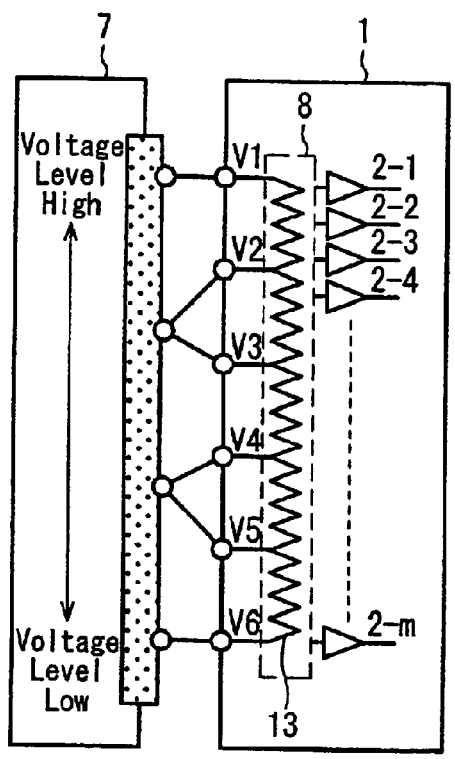
FIG. 10A and FIG. 10B show the circuit block diagrams for the input settings of the base power supply voltages for the liquid crystal driver, base power supply generation circuit of which is the Gamma correction resistance type, according to still other embodiment of the present invention.
Figure 10B:
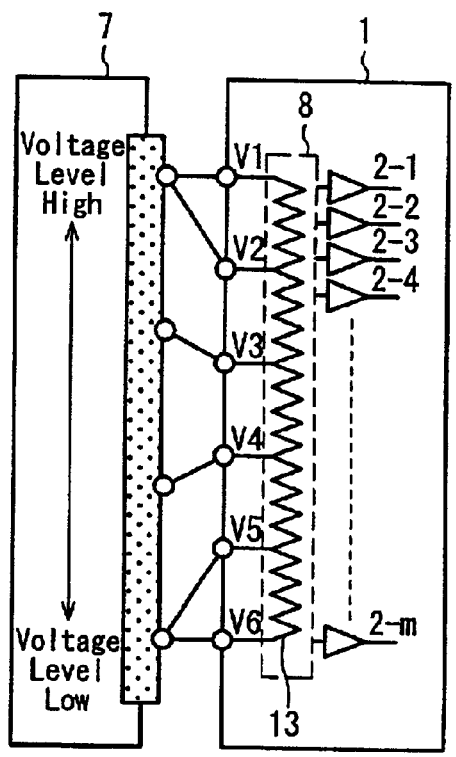

FIG. 10A and FIG. 10B show the schematic diagrams for the input settings of the base power supply voltages for a liquid crystal driver, base power supply generation circuit of which is of the Gamma correction resistance type.

The test objects are, in FIG. 10A, the DA converters corresponding to the levels in between base power supply terminals V1 to V2, and the levels in between V3 to V4, and the levels in between V5 to V6; and in FIG. 10B, the DA converters corresponding to the levels in between base power supply terminals V2 to V3, and the levels in between V4 to V5. Here, at this time, the DA converters corresponding to the V3 to V4 levels can also be tested; however, the test is already completed at the setting stage of the base power supply voltages, hence there is no need for the test as it is redundant.

FIG. 10A and FIG. 10B show the same device model as a 6 [V] driven liquid crystal driver of 64 gradations, when there are six base power supply input terminals.

As shown in FIG. 10A, if the setting values of the base power supply voltages are set to be V1=6[V], V2=4[V], V3=4[V], V4=2[V], V5=2[V] and V6=0[V], then in between the base power supply terminals V1 to V2, between V3 to V4, and between V5 to V6, a base power supply potential difference of 2 [V] can be produced. By taking the gradation levels included in between these base power supply terminals V1 to V2, between V3 to V4, and between V5 to V6 as test objects, the respective neighboring gradation output levels can have mutually a potential difference of about 154 [mV] (potential difference in between base power supply terminals 2000 [mV]/13 gradation levels, where 13, the gradation level number, is calculated from 64 gradation/5, number of base voltage intervals). Accordingly, as in the correlation diagram of the settings of the judgment levels at the time of the setting operation of the base power supply voltages and the gradation output voltage, shown in FIG. 8, for every gradation level voltage level, the setting of the judgment levels of the comparator is possible. Consequently, a test narrowing the object down to an individual gradation output voltage corresponding to the input data of one gradation level becomes possible.

For the gradation levels included in between those base power supply terminals, the input data and the settings of the judgment levels of the comparators are tested while changed sequentially, thus all the gradation levels included in that interval are tested.

Subsequently, when the gradation output voltage levels included in between the base power supply terminals V2 to V3, and between V4 to V5 are tested as shown in FIG. 10B, the input settings of the voltages applied to the base power supply terminals are changed again to make the settings of every base power supply voltage to be V1=6 [V], V2=6 [V], V3=4 [V], V4=2 [V], V5=0 [V] and V6=0 [V], and similarly all the gradation levels included in that interval are tested. Similarly, by testing every gradation output voltage level, and as the result, a test narrowing the object down to an individual gradation output voltage, corresponding to the input data of every gradation level, for all gradation output voltage levels of the liquid driver, becomes possible.

Hence, by testing every gradation output voltage level included in between the several base power supply input terminals at the semiconductor integrated circuit, regardless of the measurement accuracy of the judgment module, great reduction in the testing time and high-accuracy tests are achieved. At this time, only for every gradation output voltage level included in between the several base power supply input terminals, the output potential differences are set to expand. Meanwhile, every gradation output voltage level included in between the base power supply input terminals that are not test objects, the gradation output potential differences are set to contract. This setting condition is a dedicated testing mode in the tester.

From the above, in the testing method according to the present invention, through the mutual relation between the number of gradation levels included in between the base power supply terminals, and the drive voltage of the liquid crystal driver, and the number of base power supply terminals of the liquid crystal driver, various settings of the base power supply voltage is possible. That is, in the design stage of the liquid crystal driver, with consideration of the testing specification of the present invention, and by reflecting these mutual relations, the degree of freedom of the setting method of the base power supply voltages becomes high. The smaller the number of the gradation levels included in between the base power supply terminals, the higher the degree of freedom of the setting of the base power supply voltage. In order to handle the multi-gradation of the liquid crystal drivers, the number of base power supply terminals may be increased. As for the drive voltage of the liquid crystal drivers, as the higher the drive voltage specification, the more the division method of the voltages applied in between the base power supply terminals, the higher the degree of freedom of the settings of the base power supply voltages is.

Here, the technique of setting the base power supply voltages according to the present invention is applicable with the same effect for the point of ensuring test accuracy, even in the case of test using high-accuracy voltmeters.

Next, the embodiment of the FAIL CHECK technique making possible the characteristics related to the test programs to ensure high accuracy in the test in a short time, and the easy proof of assurance of one bit accuracy, at the time of comparator judgment by the present invention, regardless of the accuracy of the measurement and testing equipment, will be described.

First, relating to the test for the gradation output voltages due to the setting technique of the base power supply voltages according to the present invention, when testing by comparator judgment of every gradation output voltages, the flow of the setting and related problems will be described.

Figure 6:
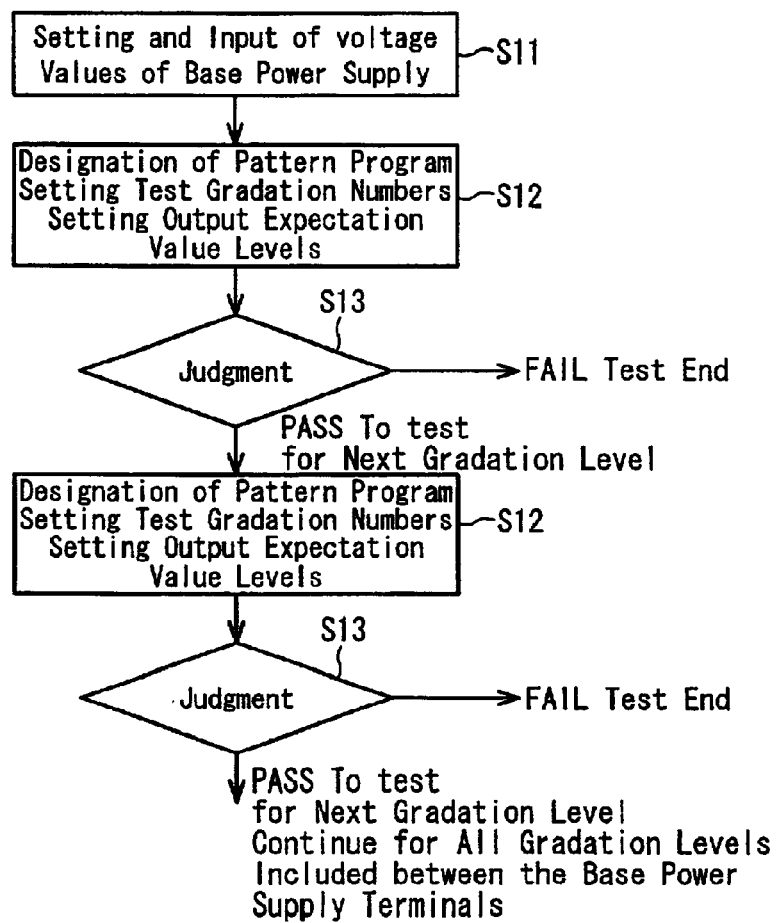
FIG. 6 is a test flow chart for judgment with a conventional comparator.

FIG. 6 shows a flow chart showing the necessary processes when testing conventional gradation output voltages by comparator judgment.

First, in step S11, the power supply for drive use to the liquid crystal driver and the base power voltages according to the aforementioned setting technique for the base power supply voltages are applied. Next, in step S12, the input data pattern program is designated. Here, the input data pattern means the data of the image (the gray scale levels corresponding to every RGB output) determining the gradation output voltages output from the liquid crystal driver. For function tests other than the usual gradation output voltage tests, one data pattern program is used for one gradation level test. Accordingly, when testing the gradation output voltages by comparator judgment, to test all the gradation output voltage levels, data pattern programs for all gradations are necessary. As the number of pattern programs that can be set in a semiconductor testing apparatus is limited, comparator judgment for gradation output voltage tests becomes difficult.

Next, the judgment width necessary for comparator judgment, and the expectation value levels of the gradation output voltages are set. This is the setting, for the gradation output voltages being the test objects, of the upper limit level and lower limit level, and to test under the condition that the gradation output voltage level is being disposed in between. It is a realizable technique because the potential differences with the neighboring upper and lower gradation voltage levels are great. Here, as for the setting voltage values of the upper limit level and the lower limit level, set values with consideration of the setting conditions of the base power supply. For example, 20 gradation levels exist in between the base power supply terminals being the test objects. If a base power supply input potential difference of 4 [V] between those base power supply terminals is set, a neighboring gradation output potential difference of 4000 [mV]/20 gradation=200 [mV/gradation] is obtained. Moreover, the judgment width of the comparator is set, with consideration of the inter-terminal fluctuation voltage (here, taken as 30 [mV]) due to the output voltage characteristics of liquid crystal drivers, and as a value not overlapping with neighboring gradation output voltage ranges, to be ±(200 [mV]–30 [mV]).

However, as the voltage recognition accuracy of comparators is about ±100 [mV], the tolerance value of the judgment width of comparators is ±100 [mV] to ±170 [mV].

This tolerance value of the judgment width of the comparator, as it determines the test accuracy, is set to be the best judgment width voltage of the comparator by the FAIL CHECK technique described later. Moreover, this relates to the liquid driver specification, and every gradation output voltage level in between the base power supply input terminals depends on the Gamma correction resistance characteristics, and have correspondence with unequal division.

The setting of the expectation values of the gradation output voltages is for the gradation output voltage level of the relevant test gradation calculated from the base power supply voltage setting values (calculated by the formula for the ideal values of the gradation output voltages in the liquid crystal driver specification), and for the calculated upper limit value and lower limit value of the judgment width of the foregoing requested comparator.

Finally, as for the gradation output voltage levels being the objects of this test, test gradation numbers are set, and in step S13, by executing the data pattern program set beforehand, judgment is possible. In the test setting step S12 and S13, by repeating a number of times equal to the number of gradation output voltage levels of the liquid crystal to be tested, all the gradation output voltage levels are tested. Accordingly, the test program testing all gradation output voltage levels is an extremely long one. In addition, the time for the optimization of the tolerance values of the judgment width of the comparator, and for debug and revision of the test programs, etc., becomes great.

In the following, the characteristics relating to the data pattern program solving the problems for aforementioned test setting flow, and the test programs, will be described in detail.

Figure 11:
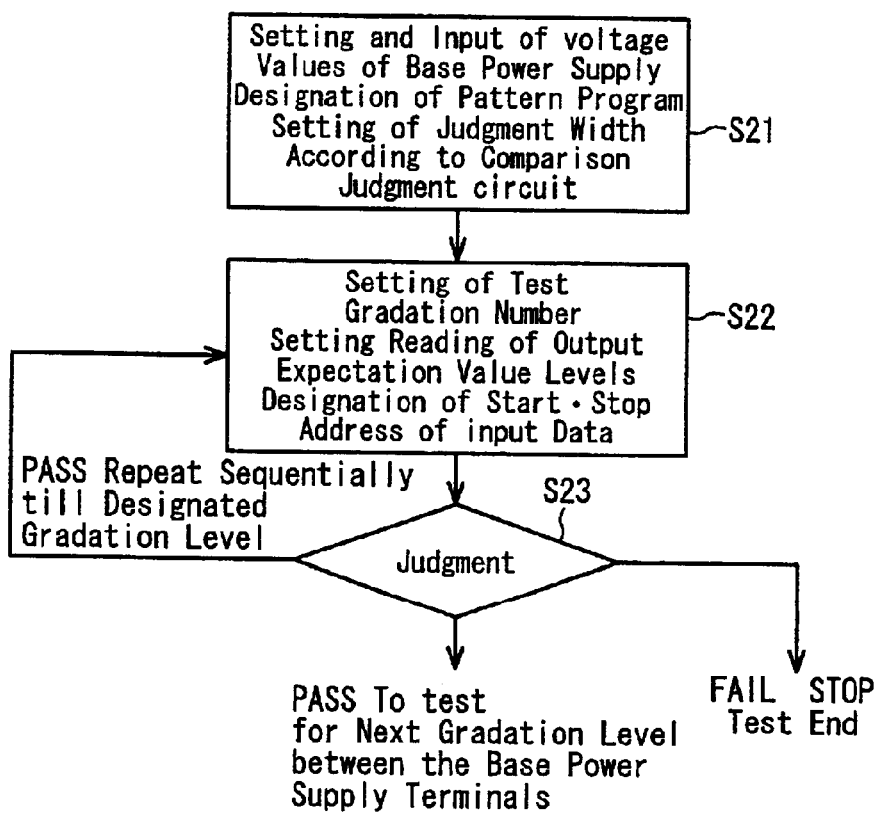
FIG. 11 is a test flow chart according to the embodiment of the present invention.

FIG. 11 shows the flow chart of the test making it possible to prove the one bit data accuracy assurance, by the technique for setting the base power supply voltages according to the present invention, and the best relation between the setting of the judgment width voltage of the comparator and the input data of the liquid crystal drive and the gradation output voltages.

The flow chart in FIG. 11 shares with the flow chart shown in FIG. 6 only the settings of the base power supply voltages. Refinement efforts are made for the items that, for every gradation output voltage level, the settings are changed.

First, in step S21, the power supply for drive use of the liquid crystal driver, and the base power supply according to the foregoing setting technique of the base power supply voltages are applied. Next, the input data pattern program is designated. As for aforementioned problem that the number of pattern programs that can be set in semiconductor testing apparatus is limited, in this technique, the input data pattern programs are sequentially linked with the gradation level data being the test objects, and unified by setting the START ADDRESS, STOP ADDRESS of the execution data for every gradation level.

Next, the judgment width required for comparator judgment is set. This is the setting, for the gradation output voltage level being the test objects, of the upper limit level and lower limit level, and to test under the condition that the gradation output voltage level is being disposed in between. Here, a setting example (method) of setting the voltage values of the upper limit level and lower limit level is common as the foregoing.

Next, the operation moves to step S22 of the test flow. Here, to sequentially test all the gradation output voltage levels included in between the base power supply terminals being the test objects for every gradation level, the setting of test gradation numbers and gradation output voltage expectation value levels, and the designation of the START ADDRESS and STOP ADDRESS of the input gradation data, are all treated as parameter settings.

The setting of the expectation value levels of the gradation output voltage is for the gradation output voltage level of the relevant test gradation calculated from the base power supply voltage setting values (calculated by the formula for the ideal values of the gradation output voltages in the liquid crystal driver specification), and for the calculated upper limit value and lower limit value of the judgment width of the foregoing requested comparator. However, the expectation value levels are read for every gradation output voltage level, and simultaneously the upper limit and lower limit values being the judgment levels of the comparator set in step S21 are set to be automatically reflected. Finally, in step S23, by executing the data pattern program set beforehand, judgment is carried out.

If this judgment result is FAIL, it is TEST END immediately. If PASS, returning to step S22, and the next gradation output voltage level is executed. At this time, the test for all the gradation output voltage levels included in between the base power supply voltage terminals set as test objects are repeated.

From the above, by the unit of the test gradation level, the mutual relation between input gradation level data and the output voltage expectation levels (judgment value levels according to comparator judgment circuit) and the time setting of the test gradation number are unified. Here, the test for every gradation level is repeated sequentially upto the designated gradation level. If all the gradation output voltage levels being test objects PASS, the operation moves to the test for the gradation levels corresponding to the settings of the next base power supply. If for some gradation level in the process, it becomes FAIL, immediately it comes to TEST END. Compared to the method of test by high-accuracy voltmeter, in which gradation output voltage test data for all gradations and all outputs are temporarily stored in memory, and judge by computational processing, it is effective in reducing the testing time for the test for the same defective device.

On the other hand, by the foregoing effect, the FAIL CHECK technique designed as a means to prove easily the assurance of one-bit accuracy will be described. Here, FAIL CHECK is, for predetermined gradation input data, due to imperfect input of the input data, etc., if an output voltage other than the expectation value is output, it can be proved that this can be selected by testing as definitely an imperfection. For instance, the judgment level range of the comparator is too great, and by confirming that the one bit corruption imperfection of the input data (the output gradation voltage is one gradation level off) is not selected as perfection, bit accuracy is ensured.

As aforementioned, the mutual relation of the input gradation data and the output voltage expectation value level (judgment value according to the comparator judgment circuit) and the setting change of the test gradation numbers with time always agree, by the unit of test object gradation level. Accordingly, if N gradation levels become the test objects, the gradation data input corresponding to the N gradations and the output voltage expectation values are set. Then, FAIL CHECK changes the output voltage expectation value of the case that those N gradation levels become the test objects to the output voltage expectation values of the N+1 gradation level, and the N−1 gradation level, and confirm that for all gradation levels, all FAIL. As aforementioned, as the output voltage expectation is set as a parameter, it can be executed by a simple change of the program. Moreover, by changing the address of the gradation input data by one gradation, the same result can be obtained. As the expectation value of the N+1 gradation level or the N−1 gradation level are shown by the last bit of the bits of the input data, testing by the test program completed by this FAIL CHECK technique can ensure one bit accuracy.

As aforementioned in detail, according to the present invention, the assurance of high accuracy in gradation output voltage tests and the reduction of testing time can be realized simultaneously.

For the test time by high-accuracy voltmeter, each of the gradation output voltages of the liquid crystal driver is tested in series for every output. In contrast, in comparator judgment, all the outputs of the gradation output voltages of the liquid crystal driver are tested in parallel simultaneously. Therefore, if the testing time is calculated for the 480 outputs of a liquid crystal driver model of 256 gradation outputs, assuming the gradation output voltage drive time (including the output delay time) of this liquid crystal driver to be 20 [$\mu$S], the voltage measurement time by the high-accuracy voltmeter is 480×256×20=2457.6 [mS].

Here, this value shows the voltmeter measurement time. As to the actual total testing time, the memory storage time for each voltage data and the computation processing time have to be further added, respectively.

As to the testing time due to comparator judgment, as all outputs can be judged altogether simultaneously, the testing time is calculated to be 1×256×20=5.12 [mS]. Hence, compared to the testing time according to conventional high-accuracy voltmeter, the testing time is reduced by 1/480 (one over the number of output terminals of the liquid crystal driver).

Moreover, the present invention does not require additional special testing circuits to the conventional inexpensive semiconductor testing apparatus, and can also handle the test for the future liquid crystal drivers with multi-output and multi-gradation, and can contribute greatly to the reduction of testing cost, and can also realize making use of existing equipment.

What is claimed is:

1. A testing method for semiconductor integrated circuits, said testing method testing by a semiconductor testing apparatus having a comparison judgment circuit judging a semiconductor integrated circuit integrated with a plurality of DA converters and a base voltage generation circuit determining gradation output voltage characteristics, by comparison of gradation output voltages of the semiconductor integrated circuit and reference voltages, comprising:
    deciding gradation level intervals to be the test objects by the setting of different voltages to be applied at the base power supply input terminals of said base voltage generation circuit;
    supplying said gradation output voltages at and between said voltages applied to said base power supply input terminals from said semiconductor testing apparatus; and
    based on a correspondence between input gradation data signals of the gradation levels for a gradation level interval, and the gradation output voltages, testing the gradation output voltage through said semiconductor testing apparatus by making a digital judgment.

2. A testing method for semiconductor integrated circuits according to claim 1, wherein,
    according to the gradation output voltages provided at and between the voltages applied to said base power supply input terminals from said semiconductor testing apparatus, said base voltage generation circuit increases or decreases the neighboring gradation output potential differences of every analog voltage output of said semiconductor integrated circuit.

3. A testing method for semiconductor integrated circuits according to claim 1, wherein,
    by assigning correspondence between the voltage settings provided from said semiconductor testing apparatus and the input data, said DA converters and the base voltage generation circuit selectively test the output levels of the analog voltage outputs.

4. A testing method for semiconductor integrated circuits according to claim 1, wherein,
    reliability of the test accuracy is acomplished by treating the mutual relationship between the computation of the input data corresponding to every output voltage level and of expectation values of the output voltages in a semiconductor integrated circuit specification and setting of the output voltage expectation value levels, and voltage judgment value levels of said comparison judgment circuit carrying out the judgment of the output voltages, and
    change of the setting of the test numbers with time, altogether as address or parameter management.

* * * * *